(12) United States Patent
Marx

(10) Patent No.: US 12,119,844 B2
(45) Date of Patent: Oct. 15, 2024

(54) METHOD AND DEVICE FOR FAST LOSSLESS COMPRESSION

(71) Applicant: MAX-PLANCK-GESELLSCHAFT ZUR FÖRDERUNG DER WISSENSCHAFTEN E.V., Munich (DE)

(72) Inventor: Ramin Marx, Zuzenhausen (DE)

(73) Assignee: MAX-PLANCK-GESELLSCHAFT ZUR FÖRDERUNG DER WISSENSCHAFTEN E.V., Munich (DE)

(*) Notice: Subject to any disclaimer, the term of this patent is extended or adjusted under 35 U.S.C. 154(b) by 181 days.

(21) Appl. No.: 17/917,938

(22) PCT Filed: Apr. 14, 2020

(86) PCT No.: PCT/EP2020/060463
§ 371 (c)(1),
(2) Date: Oct. 9, 2022

(87) PCT Pub. No.: WO2021/209119
PCT Pub. Date: Oct. 21, 2021

(65) Prior Publication Data
US 2023/0133208 A1    May 4, 2023

(51) Int. Cl.
*H03M 7/00* (2006.01)
*H03M 7/30* (2006.01)
(52) U.S. Cl.
CPC ....... *H03M 7/3066* (2013.01); *H03M 7/6011* (2013.01)

(58) Field of Classification Search
CPC .................. H03M 7/3066; H03M 7/6011
USPC ............................. 341/50, 51, 106
See application file for complete search history.

(56) References Cited

U.S. PATENT DOCUMENTS

| 8,497,788 B1 | 7/2013 | Miller et al. |
| 2005/0175115 A1* | 8/2005 | Walton ............ H04L 1/06 375/267 |

FOREIGN PATENT DOCUMENTS

| JP | WO 2005/048609 | * | 5/2005 | ............ H04N 7/50 |
| WO | WO-2005048609 A1 | * | 5/2005 | ............ G10L 19/24 |
| WO | 2013101124 A1 | | 7/2013 | |

OTHER PUBLICATIONS

WIPO, International Search Report mailed Dec. 22, 2020 in International Appln. No. PCT/EP2020/060463, (15 p.).
WIPO, Written Opinion mailed Dec. 22, 2020 in International Appln. No. PCT/EP2020/060463, (6 p.).
(Continued)

*Primary Examiner* — Peguy Jean Pierre
(74) *Attorney, Agent, or Firm* — Siritzky Law, PLLC

(57) ABSTRACT

A computer-implemented method for compressing digital data includes obtaining a sequence of digital data values; mapping the sequence of digital data values to a sequence of code words having non-uniform bit lengths; packing the sequence of code words into a sequence of storage words having uniform bit length and corresponding to a fixed-size piece of data handled as a unit by the instruction set or the hardware of a processor; and outputting the sequence of storage words together with a first bitmask indicating the bit length of each code word, wherein in the method is implemented using special purpose vector instructions.

19 Claims, 8 Drawing Sheets

(56) References Cited

OTHER PUBLICATIONS

WIPO, International Preliminary Report mailed Jul. 19, 2022 in International Appln. No. PCT/EP2020/060463, (18 p.).
Anonymous, "Data Structure Alignment," WIKIPEDIA, Feb. 29, 2020, pp. 1-15.
Anonymous, "Data with Fixed-Length Fields," Ingres 10.2 Guides. 5. Populating Tables, Dec. 31, 2018, 1 page.
Seok-Won Seong et al., "An Efficient Code Compression Technique Using Application-Aware Bitmask and Dictionary Selection Methods," Design, Automation & Test in Europe Conference & Exhibition, Apr. 1, 2007, pp. 1-6.
Cha H et al., "A Morphological Wavelet Transform," Proceedings of the International Conference on Systems, Man and Cybernetics, Oct. 17, 1993, pp. 501-506.

\* cited by examiner

Figure 3

```
mask0 = _mm256_setr_epi8(2,3,0,1,6,7,4,5,10,11,8,9,14,15,12,13,2,3,0,1,6,7,4,5,10,11,8,9,14,15,12,13);

mask1 = _mm256_set1_epi32(0x0000FFFF);

x0 = _mm256_loadu_si256(( m256i const *) v); v+=16; x1 = _mm256_loadu_si256(( m256i const *) v); v+=16;

y0 = _mm256_shuffle_epi8(x0, mask0); y1 = _mm256_shuffle_epi8(x1, mask0); x0 = _mm256_and_si256(x0, mask1); x1 = _mm256_and_si256(x1, mask1);

y0 = _mm256_and_si256(y0, mask1); y1 = _mm256_and_si256(y1, mask1); x0 = _mm256_packus_epi32(x0, x1); y0 = _mm256_packus_epi32(y0, y1); x0 = _mm256_permute4x64_epi64(x0, _MM_SHUFFLE(3, 1, 2, 0));

y0 = _mm256_permute4x64_epi64(y0, _MM_SHUFFLE(3, 1, 2, 0));

min = _mm256_min_epu16(x0, y0); sgn = _mm256_cmpeq_epi16(min, x0); d = _mm256_subs_epu16(_mm256_max_epu16(x0, y0), min);
```

Figure 5

```
if all 16 numbers fit in 8 bit {
  if all fit in 5 bit {
    if all 0: return
    if all fit in 1 bit: store 16 x 1 bit; return
    if all fit in 2 bit: store 16 x 2 bit; return
    if all fit in 3 bit: store 16 x 3 bit; return
    if all fit in 4 bit: store 16 x 4 bit; return
    if (space(2/5 bit combination) < space(5 bit)):
       store all with 2/5 bit combination; return
    if none of the above was true: store 16 x 5 bit; return
  }
  if all fit in 6 bit {
    if (space(3/6 bit combination) < space(6 bit)):
       store all with 3/6 bit combination; return
       else:
       store 16 x 6 bit; return
  }
  if (space(4/8 bit combination) <  space(8 bit)):
     store all with 4/8 bit combination; return
     else:
     store 16 x 8 bit; return
} else: {  // at least one number does not fit into 8 bit
  if all fit in 12 bit {
    if (space(6/12 bit combination) < space(12 bit)):
      if (space(8/16 bit combination) < space(6/12 bit combination)):
         store all with 8/16 bit combination; return
      else:
         store all with 6/16 bit combination; return
      if (space(8/16 bit combination) < space(12 bit)):
         store all with 8/16 bit combination; return
  }
  if (space(6/16 bit combination) < space(8/16 bit combination)): {
    if (space(6/16 bit combination) < space(16 bit)):
       store all with 6/16 bit combination; return
    else:
       store 16 x 16 bit; return
  }
  if (space(8/16 bit combination) < space(16 bit)):
     store all with 8/16 bit combination; return
  else:
     store 16 x 16 bit
}
```

Figure 7

| Value | Value (binary) | Value in Bitmask |
|---|---|---|
| 3 | 11 | 0 |
| 9 | 01001 | 1 |
| 1 | 01 | 0 |
| 2 | 10 | 0 |
| 31 | 11111 | 1 |
| 0 | 00 | 0 |
| 2 | 10 | 0 |
| 4 | 00100 | 1 |
| 1 | 01 | 0 |
| 2 | 10 | 0 |
| 20 | 10100 | 1 |
| 8 | 01000 | 1 |
| 0 | 00 | 0 |
| 0 | 00 | 0 |
| 3 | 11 | 0 |
| 17 | 10001 | 1 |

| bit mask (16 bit) | ten 2-bit values (4 bits lost) | six 5-bit values (2 bits lost) |

METHOD AND DEVICE FOR FAST LOSSLESS COMPRESSION

RELATED APPLICATIONS

This application is the National Stage (a 371) of International Application No. PCT/EP2020/060463, filed Apr. 14, 2020, the entire contents of which are hereby fully incorporated herein by reference for all purposes.

The present invention relates to a method and a device for fast lossless compression of data. In particular, it relates to fast lossless compression of 16-bit integers.

TECHNICAL BACKGROUND

Many scientific experiments measure data and convert the analog signals to 12 bit digital data (numbers from 0 to 4095), which are then stored as 16 bit unsigned integers, because this is the smallest data type≥12 bit that is supported by most computers. Usually, the measured data is noisy with only occasional signal, and the samples are strongly correlated, so the differences between samples are small.

For example, FlashCam is a digital, high-performance camera for ground-based, imaging atmospheric Cherenkov telescopes. Arrays of such telescopes, like the H.E.S.S. experiment or the future observatory CTA, are used to search for astrophysical sources of very high-energy gamma rays.

Functional key building blocks of the FlashCam design are the photodetector plane, with an area of almost 4 square meters, and a high-performance, fully digital trigger and readout system. The photodetector plane consists of 147 modules, each containing 12 photomulti-plier tubes (PMT) with peak quantum efficiencies above 40%. The analogue signals of the PMTs are digitized continuously with a sampling rate of 250 million samples per second at 12-bit resolution. The data stream of the digitized signals is processed in real time by 96 FPGA-based processors, working in parallel. Using digital filter techniques implemented on the FPGAs it is possible to identify coincidences of faint, nanosecond-long light flashes originating from air showers, and to record sequences of the corresponding images with repetition time of 4 nanoseconds. Depending on configuration, such "nano-movies" can be recorded with a duration of up to about 16 microseconds. The image data is then transferred into a high-performance server via an Ethernet-based front-end readout. Using an optimized scheme, more than 3 GByte/s can be transferred without packet loss, resulting in a dead time-free acquisition of more than 30000 image sequences per second with a duration of about 100 nanoseconds.

The huge data rates of such experiments require compression, not only for saving disk space, but also for increasing I/O speed. Often, signal extraction and noise reduction cannot be done immediately, because the complete data set is needed for the calibration afterwards. Even after calibration, one often desires to keep as much data as possible in order to recalibrate and reanalyze the data, when errors were found in the original algorithms.

While disk space has become cheap, the time for reading and writing the data (I/O) is often the bottleneck.

HDD (Hard Disks Drives) offer I/O speeds of 0.1 GB/s, and SSD (Solid State Disks) offer 1 GB/s. This is by far not enough to handle the data streams of large experiments. The solution is to install disk arrays, which can achieve aggregate speeds of some GB/s. However, the larger these arrays, the more expensive they are, not to mention the network interfaces. Moreover, since in particular astroparticle physics experiments need to be far away from cities—and thus also far away from power plants, computing centers and fast telecommunication lines—the problem of efficient data handling becomes even more important.

Compression of the data can help improve the I/O speed, because the amount of data read from or written to disk decreases by factor r, which is the compression ratio. However, when optimizing a compression algorithm for a low r, the compression speed vc and the decompression speed vd must not be disregarded. If r×v is not well above the disk I/O speed, there might be no advantage in compression.

It is important that the compression algorithm is lossless, because since it is not always possible to distinguish between signal and noise during data acquisition; it would be too dangerous to use a lossy compression algorithm and perhaps loose important parts of the data.

Most general-purpose lossless compression algorithms, like gzip, achieve good compression ratios and decompression speeds, but with insufficient compression speed. During data acquisition, however, there can be time constraints due to high data rates, so high compression speeds would be very helpful.

For example, the data rate of input stream is 2 GB/s, the compression ratio r=0.3, the compression speed 1 GB/s and the write speed of the disk is 1 GB/s. If the compression speed was fast enough, the input stream could be compressed to 0.6 GB/s and the disk could easily store it. However, since the compression speed is only 1 GB/s, it is not possible. In addition, when the input stream and the disk are the same, but a different compression algorithm is used, which compresses worse (r=0:4), but faster (3 GB/s), the input stream is compressed to 0.8 GB/s, and since the compression speed is above the input data rate, it is possible to store it to disk. Furthermore, if the (de-) compression is done quickly, there is more time for data analysis.

OBJECT OF THE INVENTION

It is therefore an object of the present invention to provide a more efficient method and system for compressing digital data.

SUMMARY OF THE INVENTION

This object is achieved by a method and a device according to the independent claims. Advantageous embodiments are defined in the dependent claims.

According to a first aspect, the invention comprises a computer-implemented method for compressing digital data, the method comprising the steps of obtaining a sequence of digital data values; mapping the sequence of digital data values to a sequence of code words; packing the sequence of code words into a sequence of storage words having uniform bit length; and outputting the sequence of storage words. According to the invention, the method further comprises the step of outputting information indicating the bit length of each code word.

A storage word may correspond to a fixed-sized piece of data handled as a unit by the instruction set or the hardware of a processor. The number of bits in a word (the bit length, the word size, word width, or word length) is reflected in many aspects of a computer's structure and operation; the majority of the registers in a processor are usually word sized The largest piece of data that can be transferred to and from the working memory in a single operation is a word in many architectures. Most advantageously, bit lengths of code words are therefore determined such that (an end of) a packed sequence of code words is aligned to a word boundary of a storage word, i.e. such that the packed sequence fully uses a given storage space.

In order to provide a very compact information, the information indicating the bit length of each code word may be a first bitmask. The first bitmask may comprise, for each code word, one or more bits indicating the bit length of the code word.

In order to make the compression adaptive to the data, while only sacrificing minimal compression speed, the method may further comprise the step of selecting one or more bit lengths of code words, based on the sequence of digital data values, wherein the sequence of digital data values is mapped to a sequence of code words, each having one of the selected bit lengths. The selection may be made by comparing storage space requirements resulting from different code word bit lengths or code word bit length combinations. In particular, the selection based on the storage requirements may be made using a binary search procedure, thereby eliminating one or more redundant explicit comparisons. Most particularly, the one or more bit lengths may be selected from the following bit lengths or bit length combinations: 0 bits, 1 bit, 2 bits, 3 bits, 4 bits, 2 or 5 bits, 5 bits, 3 or 6 bits, 6 bits, 4 or 8 bits, 8 bits, 6 or 12 bits, 12 bits, 6 or 16 bits, 8 or 16 bits, 16 bits, or any subset thereof, which experiments by the inventor have shown to provide a high compression ratio and high compression speeds at the same time.

The code words may be restricted to have non-uniform bit lengths, which means that some, but not all code words for a given block of digital data values have the same bit length. Non-uniform bit lengths of the code words may at least be two of 4, 6, 8 and 16 bits. Alternatively, the code words may have exactly two different bit lengths. In particular, the two different bit lengths of the code words may be one of the following combinations: 2/5 bits, 3/6 bits, 4/8 bits, 6/12 bits, 6/16 bits or 8/16 bits.

In order to further reduce the required storage space when using combinations of bit lengths, the step of packing the sequence of code words may include: first packing a sequence of 11 bits of each code word into the storage words, where 11 corresponds to the smallest bit length of the code words, and then packing the remaining bits of the code words having a bit length larger than 11 into the remaining storage words. Packing the remaining bits of the code words having a bit length larger than 11 may further comprise: first packing a sequence of 12-11 bits of each remaining code word into the remaining storage words, wherein 12 corresponds to the second smallest bit length of the code words, and then packing the remaining bits of the code words having a bit length larger than 12 into the then remaining storage words.

Only the absolute values of the digital data values may be mapped to code words, while the signs are coded separately. In particular, the method may further comprise the step of outputting information indicating, for each digital data value, its sign, preferably in the form of a second bitmask.

Most advantageously, the invention may be applied in the context of so-called residual transforms, which reduce an initial block of data based on a chosen data model. Here, the step of obtaining the digital data values may comprise the steps of receiving a block of original digital data; and transforming the block of original digital data in order to obtain the digital data values as residuals. Advantageously, the transform approximates the original data according to the chosen model and yields so-called residuals, which may be understood as differences between the original data and the approximation. For example, the transform may comprise subtracting a minimum of the original data block (to be coded separately) from the original data, in order to make the residuals small. Other kinds of residuals may be obtained by methods known in the field of predictive coding, in particular audio and image coding, wherein signal components are predicted according to an image or sound model. Most particularly, the block of original digital data may be transformed using a wavelet transform. The wavelet transform may be a morphological wavelet transform or an iterated wavelet transform. The wavelet transform may be iterated 4 times.

According to a second aspect, the invention also provides methods for decoding data coded according to the previous methods, based on the bit length indicator(s) and coded data.

Most advantageously, the relative simplicity of the inventive method allows it to be implemented with a high amount of parallelization and/or using AVX2 or similar special-purpose processor instructions.

The various embodiments of the invention described herein present a tradeoff between speed and compression ratio. They do not provide the maximum possible compression, but are very fast, resulting in significantly increased I/O speed. They are based on the assumption that the input data consists of consecutive unsigned 16-bit integers, where the differences of the integers are small. Moreover, even if some of the input values are not subject to this constraint, effective compression is still possible.

BRIEF DESCRIPTION OF THE FIGURES

FIG. 3 shows a possible implementation of the method shown in FIG. 4.

FIG. 5 shows an alternative method for determining a bit range (combination).

FIG. 7 shows an example of a 2/5 bit encoding of 16 values. In the encoded stream, the bitmask is sent first (2 bytes), followed by ten 2-bit values (20 bits→3 bytes), followed by six 5-bit values (30 bit→4 bytes).

DETAILED DESCRIPTION

Figure 1:
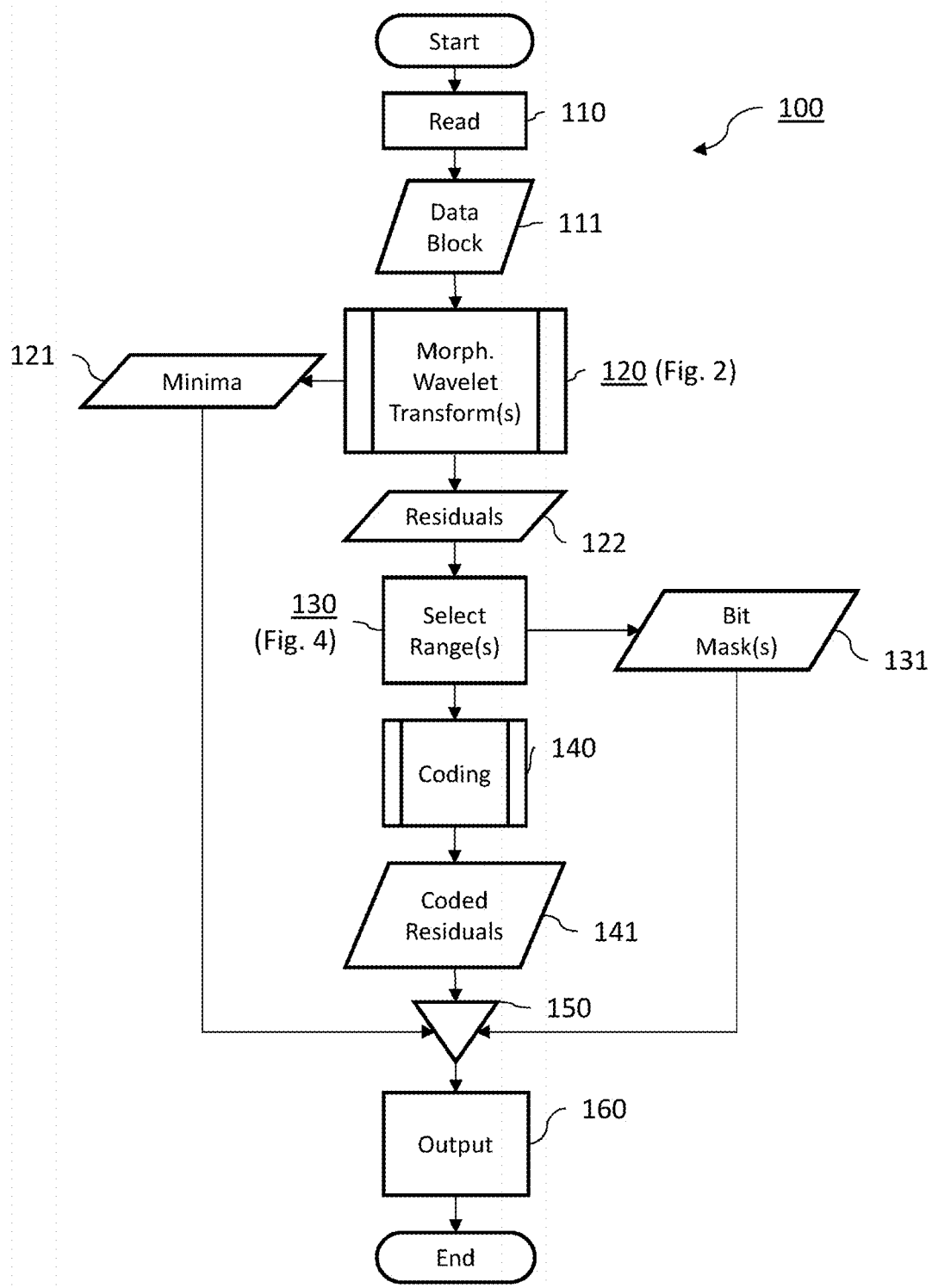
FIG. 1 shows a flowchart of a method for compressing digital data according to an embodiment of the invention.

FIG. 1 shows flowchart of a method 100 for compressing digital data according to a further embodiment of the invention.

Figure 2:
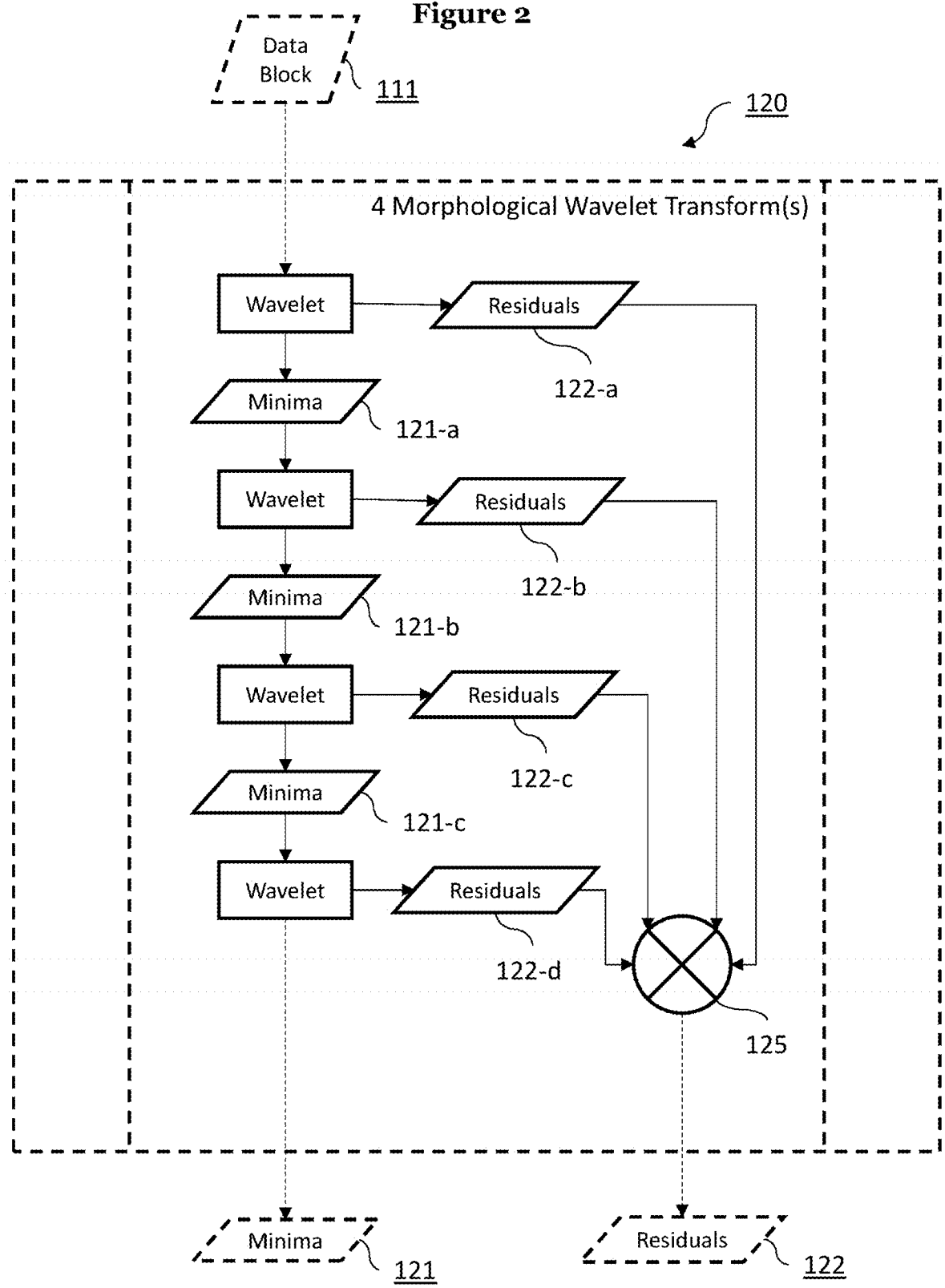
FIG. 2 shows a more detailed flowchart of the iterated morphological wavelet transform step 120 in FIG. 1.

A block 111 of unsigned 16-bit integers is read in step 110. In step 120, one or more so-called morphological wavelet transforms, which will be explained in more detail in relation to FIG. 2, are applied to the block 111, in order to obtain one or more minima 121 and one or more residuals 122. Based on the residuals 322, one or more bit ranges used for encoding the residuals are selected in step 130. An indicator, e.g. a bitmask 131 is output, which indicates the selected bit range(s). In step 140, the residuals are then coded based on the one or more selected bit range(s) in order to obtain coded residuals 141. In step 150, the minima 121, which may also have been coded (not shown), the coded residuals 141 and the bit mask(s) 131 are then combined and output in step 160.

Then, if there are more than 256 values left to compress, the method returns (not shown) to the beginning step 110, and otherwise copies the remaining values to the output and returns.

Parallelization of this algorithm is possible, because larger blocks can be processed independently.

FIG. 2 shows a more detailed flowchart of the iterated morphological wavelet transform step 120 in FIG. 1.

Mathematical morphology is a theory for the analysis of geometric structures. The basic concept is to traverse the structure X with a structuring element B and modify each point according to the desired operation:

dilation: $\delta_B(X) = X \oplus B = \cup_{x \in X} B_x$ erosion: $\epsilon_B(X) = X \ominus B = \{x | B_x \in B\}$ with $B_x = \{b+x | b \in B\}$. Therefore, the dilation is the union set of all points in X, each extended by the neighborhood defined by B, and the erosion is the set of all points in X for which B, translated to that point, lies completely in X. A dilation inflates the object, closes small holes inside, and bays at the border of the object, whereas an erosion deflates the object and removes small islands outside and land tongues at the border of the object.

This concept can be extended from bitmasks to grayscale images and other signals. Let f be the input signal and b the structuring function that has support B. Dilation and erosion are then defined as:

$$(f \oplus b)(x) = \max_{z \in B}(f(x+z)) \quad (11.15)$$

$$(f \ominus b)(x) = \min_{z \in B}(f(x+z)) \quad (11.16)$$

In case of the 1-dimensional 16-bit unsigned integer input stream that has to be compressed, the structuring element is chosen to be only 2 pixels wide. If erosion is then used as low-pass filter and the difference of eroded signal and the original signal as high-pass filter, a morphological wavelet transform can be defined as follows:

$$s_i = \min(v_{2i}, v_{2i+1}) \quad (11.17)$$

$$d_i = v_{2i} - v_{2i+1} \quad (11.18)$$

The inverse transformation is $$v_{2i} = s_i + \max(d_i, 0) \quad (11.19)$$

$$v_{2i+1} = s_i - \min(d_i, 0) \quad (11.20)$$

The minima are guaranteed to stay in the range of an unsigned short (0 ... 65535), the differences, however, can exceed that range—they are in the interval [−65535 ... 65535]. Extracting and storing the signs of the differences prevents such overflows. In addition, since the input data is noisy, the signs of the differences are mostly random, so there is no negative impact on the compression ratio.

In contrast to other wavelets that usually use the mean as low-pass filter, morphological wavelets do not merge spikes into the subsampled signal, resulting in smaller differences at the next decomposition level and thus, in a better compression ratio.

For example, given an input signal v being a noisy baseline with occasional spikes on top, M (v) the pairwise mean of v, m(v) the pairwise minimum of v, and d(v) the pairwise absolute differences of v

| | |
|---|---|
| v = (1, 0, 3, 1, 100, 4, 1, 4) | d(v) = (1, 2, 96, 3) |
| M (v) = (0, 2, 52, 2) | d(M (v)) = (2, 50) |
| M (M (v)) = (1, 27) | d(M (M (v))) = (26) |
| M (M (M (v))) = (14) | |
| m(v) = (0, 1, 4, 1) | d(m(v)) = (1, 3) |
| m(m(v)) = (1, 1) | d(d(m(v))) = (0) |
| m(m(m(v))) = (1) | |

The residuals to encode when using the mean are 1, 2, 96, 3, 2, 50, 26, 14, but when using the minimum the residuals are 1, 2, 96, 3, 1, 3, 0, 1. This example shows how the mean carries spikes down to lower wavelet levels, resulting in larger differences overall, whereas the minimum rids itself of the spikes early, resulting in smaller differences. The worst case for this wavelet transform is a high baseline with occasional downward spikes, in which case the maximum of pairwise samples would be the better low-pass filter in the wavelet decomposition. However, in most data sets, the baseline is below the signal, and marking whether the minimum or the maximum was used would consume extra header space.

These calculations can be executed efficiently with AVX2 instructions, using only one cycle for calculating 16 differences or 16 minima. However, much more time is spent on rearranging and preparing the data inside the registers.

FIG. 3 shows an example implementation of how 32 unsigned shorts are read from memory and transformed using the morphological wavelet just described.

Figure 4:
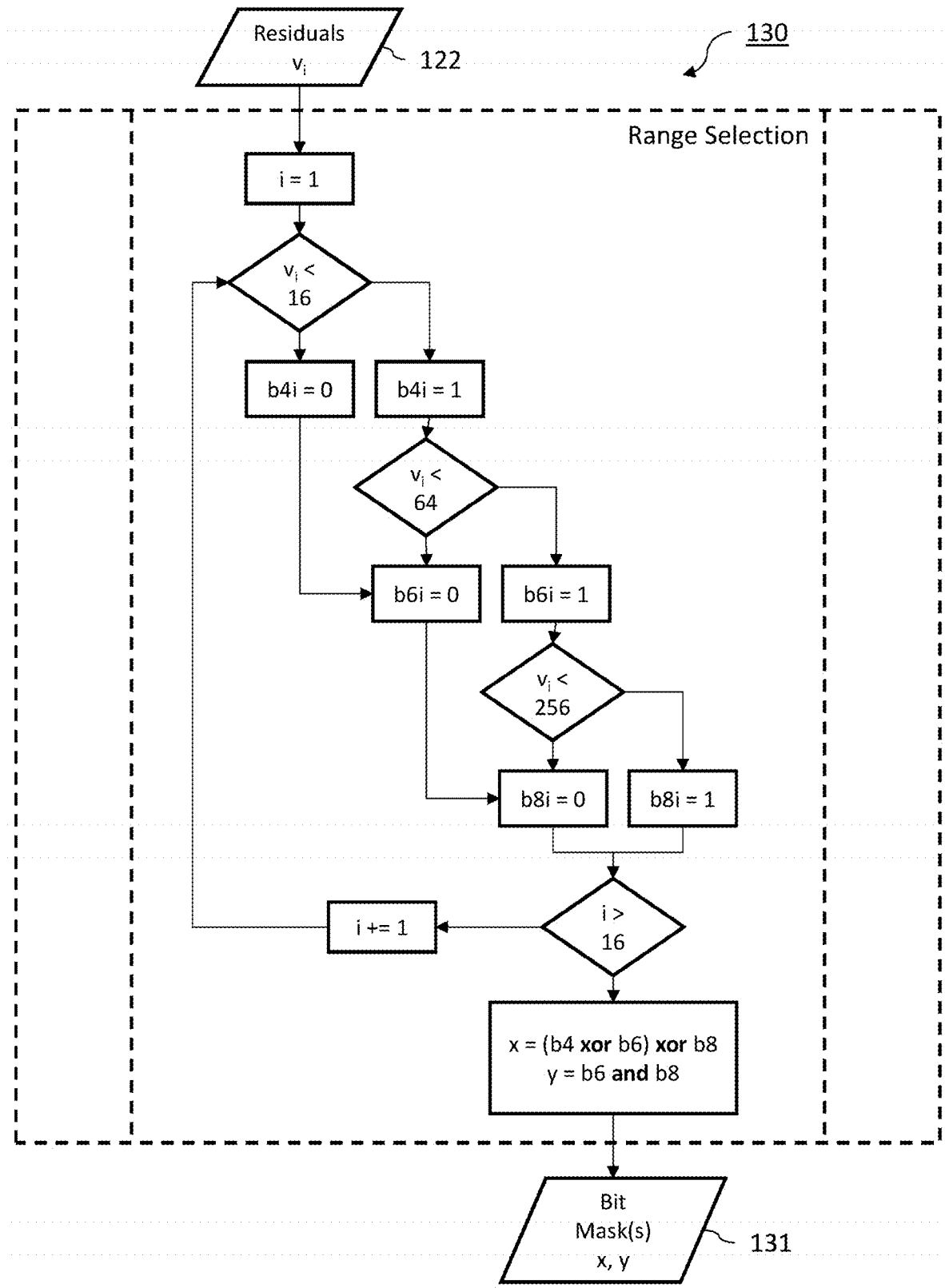
FIG. 4 shows a method for determining a bit range (combination).

In the compression algorithm, blocks of 256 values are transformed to 128 minima and 128 differences. The differences are usually small, while the minima need to be transformed again, in order to yield 64 minima and 64 differences. This recursive process could continue until there is only one minimum and 255 differences left, however, here it stops at the fourth level, yielding 240 differences and 16 minima. Further decompositions would not exploit the parallelism offered by AVX2 fully, because the last 16 minima at the fourth level would have to be split up to two half-filled AVX2 registers:

FIG. 4 shows a flowchart of a method for bitmask selection that can be used in step 130 of FIG. 1.

The residuals produced by the wavelet transform are all in the interval [0 . . . 65535], because the signs are stored separately. Usually, they are very small, so they can be stored using much less than the 16 bit the original numbers used. However, using range coding alone for a block of 16 residuals (as in the first embodiment), even one single large value forces the other 15 values of the block to be encoded with more bits.

In order to deal with such outliers, it is proposed to use a bit mask for distinguishing different ranges and then to store the values with the necessary number of bits. For example, if the two ranges are 4 bit and 16 bit and 11 numbers are 4-bit while 5 numbers are 16-bit, there is an overhead of 16 bits for the mask plus 11×4 bits plus 5×16 bits for the values. Additional 4 bits are lost, because the 44 bits of 4-bit values are not aligned to a byte border. This adds up to 16+44+80+4=144 bits compared to the original 256 bits. If there were 11×4 bits and 5×12 bits to store, 2×4 bits are lost because of byte alignment. Although it is possible to concatenate the two-bit streams before storing them to memory, such bit handling is expensive and complicated with AVX2.

The problem with a single bit mask is that it provides only for two ranges and it is not clear which ranges to choose. 4 bit and 16 bit might be good values for some data, but for other data, 2 bit and 8 bit might be better. In order to be flexible towards different noise levels and outliers, the ranges 4, 6, 8 and 16 bit are chosen. Marking the required range requires an overhead of 2 bits per number, for the four possibilities 4, 6, 8 or 16 bit.

The four (4) least significant bits (bits 0-3) of all 16 numbers are always stored. Then, for all numbers that do not fit into the 4-bit range, the next 2 bits (bits 4 and 5) are stored. Then, for all numbers that do not fit into the 6-bit range, the next 2 bits (bits 6 and 7) are stored. Finally, for all numbers that do not fit into the 8-bit range, the last 8 bits (bits 8-15) are stored.

Thus, for a block v of 16 unsigned shorts, the three bit masks are created as follows:

$$b4_i = v_i < 16 (->1 \text{ if true, 0 otherwise})$$

$$b6_i = v_i < 64 (->1 \text{ if true, 0 otherwise}) \quad (11.21)$$

$$b8_i = v_i < 256 (->1 \text{ if true, 0 otherwise})$$

A small gain in compression ratio can be achieved by exploiting the fact that the bitmasks already exclude some ranges. For example, if the bitmasks indicate that the number needs 6 bits to be stored, it cannot be a number from 0 . . . 15. So the range for 6 bit numbers can be shifted from 0 . . . 15 to 16 . . . 79. The same holds for the 8 bit range, which can be shifted from 0 . . . 255 to 80 . . . 335. These optimizations are done in the algorithm, but in order to keep the following examples clear, they are not done here.

The three masks are convenient to have for the algorithm, but storing them as they are would not be good, because they are redundant, which is easy to see because since each number is in exactly one of the four ranges, 2 bit must suffice to store the number. The following transformation combines the three masks into two masks:

$$x = (b4 \text{ xor } b6) \text{ xor } b8 \; y = b6 \text{ and } b8 \quad (11.22)$$

The inverse transformation is:

$$b4 = x \text{ or } y \; b6 = y \; b8 = x \text{ and } y \quad (11.23)$$

For the following example of a block v of 16 unsigned shorts, $B_i$ is the number of bits needed to store $v_i$, b4, b6 and b8 are the bitmasks that define which of the ranges (4, 6, 8, 16) needs to be used for storing a number, and x and y are the transformed bit masks.
v=(0,20,2,1,19023,550,128,127,255,256,60,70,14,102, 22,62)
B=(0, 5, 2, 1, 15, 10, 8, 7, 8, 9, 6, 7, 4, 7, 5, 6)
b4=(0, 1, 0, 0, 1, 1, 1, 1, 1, 1, 1, 1, 0, 1, 1, 1)
b6=(0, 0, 0, 0, 1, 1, 1, 1, 1, 1, 0, 1, 0, 1, 0, 0)
b8=(0, 0, 0, 0, 1, 1, 0, 0, 0, 1, 0, 0, 0, 0, 0, 0)
x=(0, 1, 0, 0, 1, 1, 0, 0, 0, 1, 1, 0, 0, 0, 1, 1)
y=(0, 0, 0, 0, 1, 1, 0, 0, 0, 1, 0, 0, 0, 0, 0, 0)
The output of this bitmask encoding is:
the bit masks x and y;
the bits 0-3 of all values in v;
bits 4-5 of all $v_i$ for which b4i=1;
bits 6-7 of all $v_i$ for which b6i=1;
bits 8-15 of all $v_i$ for which b8i=1.

This algorithm is robust to outliers and noisy data, achieves good compression ratio and speeds of 1.8 GB/s per core for typical data. However, after some testing with different data sets, it turned out that the compression ratio was not always as good as expected.

In order to increase the compression ratio even more, a further embodiment of the invention proposes not to hard-code the ranges (4, 6, 8 and 16 bit), but to use dynamic ranges instead.

FIG. 5 shows a flowchart of an alternative method for range/bitmask selection that can be used in step 130 of FIG. 1.

According to this embodiment, the final encoding chooses from 16 different ranges and range combinations the one that results in the best compression ratio, instead of using one fixed 2-bit mask, like in previous method. On the one hand, a bitmask indicating which of the 16 encodings was the optimal one consumes additional 4 header bits, but on the other hand, the overhead of 32 bits that are necessary for the 4-6-8-16 bit encoding of the previous method is gone. However, as will be shown now, some of the 16 encodings use a bit mask as well, but those bit masks only distinguish between two ranges and thus only consume 1 bit per value, so for the whole block of 16 values an overhead of only 16 bits is lost.

More particularly, the 16 unsigned 16-bit values (i.e. 16 numbers from 0 to 65535) need to be stored in a memory and time efficient way. The values are the residuals (difference limits of wavelet decomposition), so they are usually small and noisy, and it is not worth trying to compress them further. Since they are small, one does not need to use 16 bits for each value, but can try to compress them with fewer bits. One could simply find the largest of the 16 numbers and store all values with the bit range of that number. However, if the number were an outlier, it would be better to store most numbers with a smaller bit range and store the outlier separately with the higher bit range.

When searching for the best bit range or bit range combination, the following aspects must be considered:

1. if a bit range is stored, then only the header needs to contain the bit range selected, and then all numbers are stored with the bit range. Example: 1 0 3 2 1 3. 2 bits are sufficient here. However, if many of the numbers could be stored with fewer bits, it might be useful to store the numbers with a bit range combination. For example: 1 0 3 200 1 3, where all the numbers are stored with 2 bits and the 200 with 8 bits. The disadvantage of the bit range combination is the need for a bit mask that shows where the (in this example) 2 bit and 8 bit numbers are stored. The mask would look like this: 000100, with 16 numbers it is 16 bits long. The best tradeoff between "bit range" and "bit mask +bit range combination" must be found.

2. the bit range or bit range combination should match the numbers to be stored as well as possible, so that no memory space is wasted.

3. the search for the best bit range combination must be fast, so not too many bit range combinations should be tested.

4. the bit range combinations should be chosen in a way that the saving is fast. For example, given 7 bits and 15 bits as bit range combinations (i.e., each of the 16 numbers is coded either with 7 or 15 bits), then many bits have to be moved around and word (byte) boundaries have to be taken into account. For example, the bit range combination 8 bit and 16 bit is much faster.

In the present embodiment, the following 16 bit ranges and bit range combinations are proposed: 0, 1, 2, 3, 4, 2/5, 5, 3/6, 6, 4/8, 8, 6/12, 12, 6/16, 8/16, 16. For each block of 16 numbers, 4 bits must be used to indicate which of the $2^4=16$ bit range (combinations) was used.

For a block of 16 unsigned shorts, it is first checked how many of them need how many bits to encode. Based on the distribution of the required bit ranges, it is decided if all of them are stored as n-bit values or if bitmask encoding is used and some of them are stored as n-bit values and the rest as m-bit values:

- 0-bit range: all values are 0: do not write anything
- 1-bit range: each value can be encoded using 1 bit: the 16×1 bit are stored
- 2-bit range: each value can be encoded using 2 bits: the 16×2 bits are stored
- 3-bit range: each value can be encoded using 3 bits: the 16×3 bits are stored
- 4-bit range: each value can be encoded using 4 bits: the 16×4 bits are stored
- 2/5 bit mask: no value exceeds 5 bit and there are enough 2-bit values to make bit mask encoding pay off, compared to storing all values with 5 bit: store the bit mask, the lowest 2 bit of all values and the higher 3 bit of all 5-bit values
- 5-bit range: each value can be encoded using 5 bits: the 16×5 bits are stored
- 3/6 bit mask: no value exceeds 6 bit and there are enough 3-bit values to make bit mask encoding pay off, compared to storing all values with 6 bit: store the bit mask, the lowest 3 bit of all values and the higher 3 bit of all 6-bit values
- 6-bit range: each value can be encoded using 6 bits: the 16×6 bits are stored
- 4/8 bit mask: no value exceeds 8 bit and there are enough 4-bit values to make bit mask encoding pay off, compared to storing all values with 8 bit: store the bit mask, the lowest 4 bit of all values and the higher 4 bit of all 8-bit values
- 8-bit range: each value can be encoded using 8 bits: the 16×8 bits are stored
- 6/12 bit mask: no value exceeds 12 bit and there are enough 6-bit values to make bit mask encoding pay off, compared to storing all values with 12 bit: store the bit mask, the lowest 6 bit of all values and the higher 6 bit of all 12-bit values
- 12-bit range: each value can be encoded using 12 bits: the 16×12 bits are stored
- 6/16 bit mask: there are enough 6-bit values to make bit mask encoding pay off, compared to storing all values with 16 bit: store the bit mask, the lowest 6 bit of all values and the higher 10 bit of all 16-bit values
- 8/16 bit mask: there are enough 8-bit values to make bit mask encoding pay off, compared to storing all values with 16 bit: store the bit mask, the lowest 8 bit of all values and the higher 8 bit of all 16-bit values
- 16-bit range: the 16×16 bits are stored For each block of 16 unsigned shorts, the encoding that uses the least number of bits is chosen.

Figure 6:
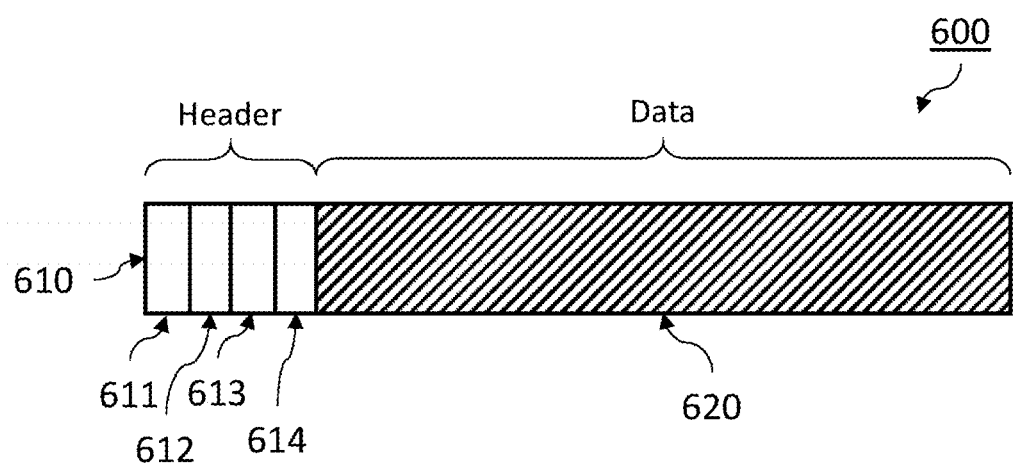
FIG. 6 shows a layout of a block of compressed digital data according to an embodiment of the invention.

FIG. 6 shows (in pseudocode) a binary search method for determining an appropriate bit range (combination). The function 'space' in the pseudocode of FIG. 6 measures the space requirement using a particular coding scheme, e.g. using a 6/16 combination.

A similar scheme may be built for 8-bit, 32-bit or 64-bit data. For example, 8-bit data can be coded using the following bit ranges: 0, 1, 2, 4, 2/6, 4/6, 4/8 and 8.

Since there are 16 different encodings, 4 header bits are needed to tell which encoding was chosen. Being able to choose from more than these 16 possibilities would certainly help encoding the numbers even better, but more than 4 header bits would be needed, and furthermore, more encodings would require more range tests, which would slow down the algorithm. The above combinations are a compromise between compression ratio and speed, because they cover many noise levels, signal strengths, and still do not require too much checking. Most importantly, they are simple enough to be programmed with AVX2 instructions, which is usually not true for more sophisticated algorithms, especially if they use Huffman trees and bit streams.

The layout of a compressed block of 16×16 values is:

| Size [bytes] | Content |
| --- | --- |
| 8 | 16 times the choice between 16 = 24 bit ranges (16 × 4 bits) |
| 3 | the position of the two variable-length blocks in the encoded block |
| 2 | the smallest of the 16 minima |
| 30 | 15 sign masks (15 × 16 bits = 30 bytes) |
| variable | 16 variable length blocks with differences encoded at bit level |

Since the 16 4-bit range specifiers are consecutively stored as a 64-bit number, it is possible to check using one single if-instruction, if the data was incompressible. As can be seen in the list of encodings above, if a block of 16 values is not compressible and can only be stored by copying them, its 4-bit header is 15, which is 1111 in binary. If all 16 blocks are stored in that way, the 64 bit number has all bits set, which can be checked with if (x==−1), where x is the 64 bit long integer that contains the 16 4-bit range specifiers.

Incompressible data usually has all header bits set to one (1). However, if not correctly aligned to a 16-bit boundary in memory, compressible 16-bit data also has all header bits set to one (1), which happens if the file with the data to be compressed has an odd number of header bytes. Here are two examples that show the importance of correct alignment for 16 bit unsigned integer compression.

EXAMPLE 1

| Byte | 0 | 1 | 2 | 3 | 4 | 5 |
| --- | --- | --- | --- | --- | --- | --- |
| Bits | 10101010 | 00000000 | 11111111 | 00000000 | 00100100 | 00000000 |
| 16 bit int | 170 | | 255 | | 36 | |

In example 1, the data is aligned to 16 bit, so the algorithm would be able to store the numbers as at least 8-bit values instead of 16-bit values. In the next example, the numbers are the same, but a header byte is added, which causes the numbers to be unaligned.

EXAMPLE 2

| Byte | 0 | 1 | 2 | 3 | 4 | 5 |
|---|---|---|---|---|---|---|
| Bits | 00000000 | 10101010 | 00000000 | 11111111 | 00000000 | 00100100 |
| 16 bit int | | 43520 | | 65280 | | 9216 |

In example 2, the data is not aligned to 16 bit anymore, so the lower byte becomes the upper byte and thus, the data becomes incompressible for the range encoder.

In such a case, all 64 header bits are set to one, signaling that the data is misaligned (or really not compressible). The block of 256 values are not re-read, but instead simply be written without compression. Afterwards, however, the next byte from the input stream is simply copied (to the output stream), causing the input stream to be aligned to 16 bit. If the data is incompressible, this does not improve anything, but neither does is make anything worse.

FIG. 7 shows an example of a 2/5 bit encoding of 16 values. In the encoded stream, the bitmask is sent first (2 bytes), followed by ten 2-bit values (20 bits→3 bytes), followed by six 5-bit values (30 bit→4 bytes).

Optionally, heuristical checks (not shown) may be carried out during the initial reading step 120 to catch long sequences of constants or incompressible data.

Benchmark

Figure 8:
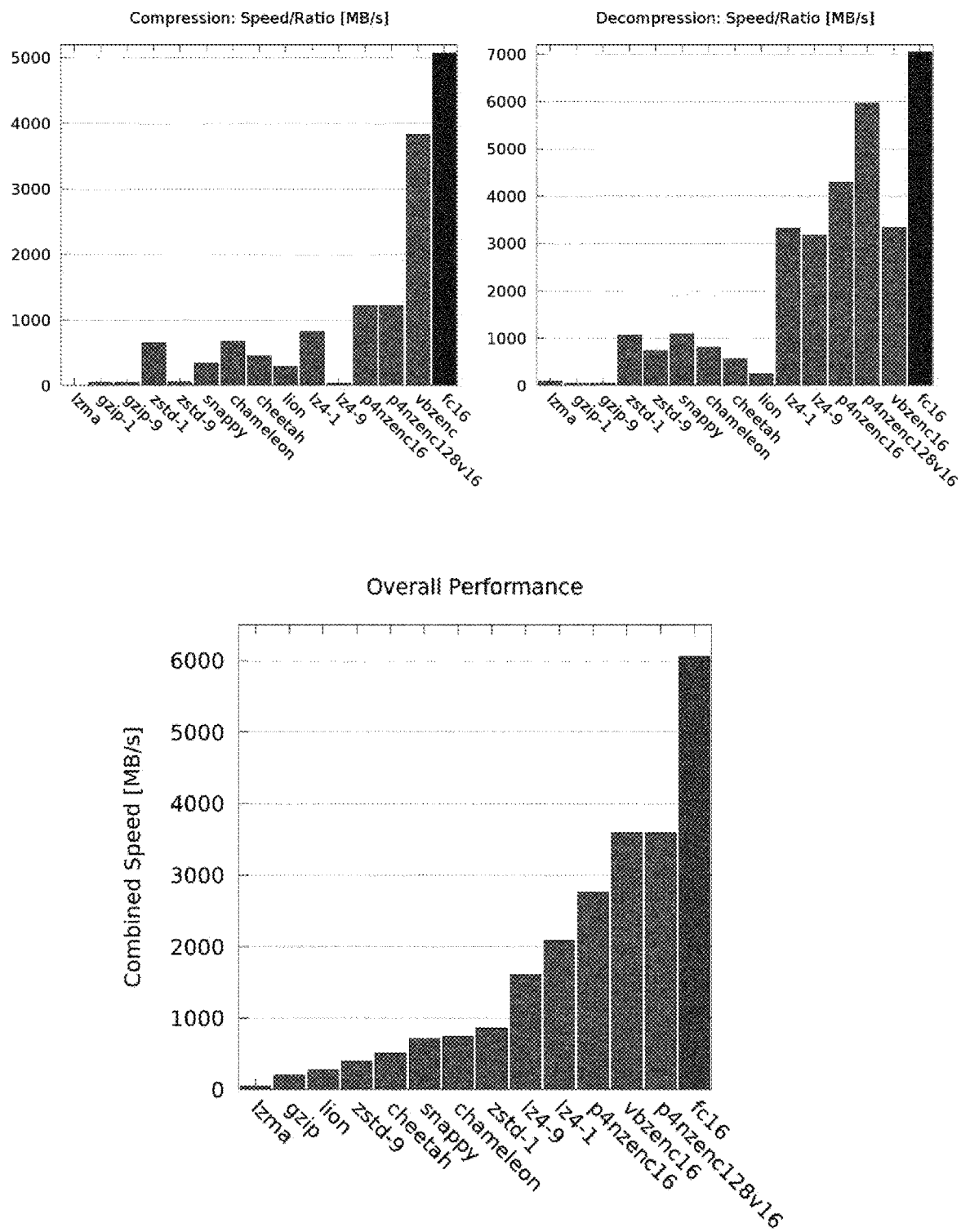
FIG. 8 shows results of a comparison of the inventive method with known compression methods.

FIG. 8 shows results of a comparison of the inventive method with known compression methods. Here, the method described in connection with FIG. 1 (in the following referred to as fc16) is compared to state-of-the-art compression programs in the following table:

| Program | Version | Command line in benchmark |
|---|---|---|
| lzma[42] | 5.2.2 | lzma FILE |
| gzip[43] | 1.5 | gzip -1/-9 FILE (fast/best compression) |
| zstd[44] | 1.3.3 | zstd -b1/-b9 FILE (fast/best compression) |
| snappy[45] | 1.1.7 | snappy_unittest FILE |
| density[46] | 0.14.2 | density benchmark FILE (Chameleon, Cheetah, Lion) |
| lz4[47] | 1.8.2 | lz4 -1/-9 FILE (fast/best compression) |
| TurboPFor[48] | 03.2018 | icapp -s2 FILE (p4nzenc16, p4nzenc128v16, vbzenc16) |
| fc16 | 0 | fc16 < IN > OUT |

From the various compression algorithms the libraries density and TurboPFor offer, the ones mentioned here in the table performed best on the data set of this benchmark.

Some programs allow control over the compression ratio in exchange for compression speed. Usually, this is done over the command line switches -1 (maximum speed) and -9 (maximum compression). The benchmarks were run on a 20-core Intel(R) Xeon(R) CPU E5-2698 v4 @2.20 GHz with 512 GB RAM, 32 kB L1-cache per core, 256 kB L2-cache per core, and ≈1 GB/s disk I/O speed. All programs in this benchmark were run with a single thread, without any other demanding programs running on the machine. Since the (de-) compression speeds can be close to or above the disk I/O speed, all benchmarks were done in-memory using the programs supplied by the authors, so the disk I/O does not throttle the algorithm. For gzip and lzma, there is no in-memory benchmark mode, but since their bottleneck is not the I/O, they simply read the test files from disk and write the compressed output to /dev/null, which means that the output is discarded and no time spent on writing anything to disk. Algorithms 1-3 are not part of this benchmark, because they are in all aspects inferior to algorithm 4 (fc16). There are many other compressors, but the above list covers everything from best compression ratio to fastest compression. Comparing to lzma, gzip, zstd, snappy and density is unfair, because those are general-purpose compressors, which means that they can compress any type of data, not just integers, like TurboPFor and fc16. However, since many scientists use them on their data, it might be interesting for them to know how the compression ratio and speed would change, if they used TurboPFor or fc16. Since the compression suites TurboPFor and density provide several compressors, the best three are included in this benchmark.

The test data set comprises the following files (ordered from low noise levels to high noise levels): hawc.dat (HAWC data), gerda.dat (GERDA data), ctamc.dat (CTA prod3 Monte Carlo simulations), fc_300MHz.dat (Flash-Cam artificially triggered data with a photon rate of 300 MHz/pixel), fc_1200MHz.dat (FlashCam artificially triggered data with a photon rate of 1200 MHz/pixel), chec.dat (CHEC-S data, not aligned to 16 bit) and chec_aligned.dat (the same as chec.dat, but with the first byte of the file removed, so the data is aligned to 16 bit).

Results

As can be seen in FIG. 8, fc16 compresses almost as good as the strongest compression algorithm (lzma), but 3 orders of magnitude faster. The closest competitor in compression speed (vbzenc16) has a much worse compression ratio and decompresses significantly slower. Also, its compression speed drops down to half the compression speed of fc1 6, when the data is not that simple to compress (CHEC and ctamc). The closest competitors in decompression speed and compression ratio (p4nzenc16 and p4nzenc128v16) compress 80% slower than fc16. They have a slightly better compression ratio than fc16, but decompress slower in almost all cases. Furthermore, they cannot handle unaligned data.

When compared to the other fast integer compression algorithms p4nzenc16 and p4nzenc128v16, and is almost always the fastest compressor and decompressor. The general-purpose compressors snappy, chameleon, cheetah, lion and lz4 lose against fc16, because they are slower and their compression ratio is worse. The other general-purpose compressors lzma, gzip and zstd rival fc16 in compression ratio, but are orders of magnitude slower.

The two top plots in FIG. 8 show the average ratio of (de)compression speed and compression ratio for all data sets. These numbers are important, because they tell the user how much uncompressed data can be processed ("written and compressed" or "read and decompressed"). The bottom plot combines compression speed, decompression speed and compression ratio. It shows the mean of compression and decompression speed, divided by compression ratio, which is the average speed in which uncompressed data can be processed.

Since p4nzenc16 and p4nzenc128v16 have the same compression ratio and compression speed, they have been merged. The same has been done for gzip-1, gzip-9 and zstd-9.

Parallelism

The inventive method can be parallelized very easily because a block that is processed independently is only 512 bytes in size. Such a small block size also simplifies the implementation in hardware.

The parallelizability is also reflected in the implementation of fc16. It uses multiple threads, whereby the input stream is divided into blocks of typically about 1 MB and then each block is processed in a separate thread. Per thread, compression speeds of 2-3 GB/s and decompression speeds of 3-4 GB/s are achieved on normal desktop PCs. The speeds increase with the number of threads, but not linearly. In in-memory tests, multiple threads on a Xeon processor achieved compression speeds of over 10 GB/s.

The algorithm has also been specially designed to run quickly on CPUs with vector instructions. For the implementation with AVX2, a block size of 16 16-bit numbers was used, because AVX2 registers are 256 bit large.

The parallelization on this smallest level then works by applying one arithmetic operation to all 16 numbers simultaneously. For example: 16 numbers $x[0], x[1], \ldots, x[15]$ in an AVX2 register from which one wants to subtract one number n: AVX2 works in principle like this: y=vector_subtract(x, n), costing one processor clock cycle. Using serial programming, one would have to use a loop: for (i=0; i<16; i++) {y[i]=x[i]−n;} costing a lot more clock cycles. The inventive fc16-algorithm is kept extra simple, so that it is almost only made up of such simple operations as addition, subtraction, comparison etc., which exist as vector instructions and which usually only need one clock cycle.

When designing an algorithm that should be parallelizable with AVX2, one is extremely limited because fewer arithmetic operations are at one's disposal and (even more important) because all numbers in a register are treated equally.

In conclusion, the reasons for the suitability of the inventive method for parallelization are:
- the algorithm itself (and the corresponding hard-coded dictionary), from which the simple arithmetic operations result, which are the same for every number in the register.
- the small block size of 256 numbers (-->512 bytes), which are processed independently.

Energy Efficiency

The algorithm is more energy-efficient than conventional algorithms that first have to construct a Huffman tree or similar.

Applications

Since the algorithm is also suitable for image compression, there are many possible applications. For example, during test drives of self-propelled cars, all sensor data (over 90% are 12 bit RGB raw streams as in the benchmark above) are recorded, so that later it can be understood why the system reacted in what way. Per day and car 50-100 TB of data are stored on such a test drive. All data are recorded without loss and data storage is a limiting factor. There are companies that have specialized in selling such recording boxes to car manufacturers. With the inventive method, the data acquisition rate or data capacity can be doubled.

As a further example, when professional photographers take serial pictures with their SLR cameras with e.g. 50 megapixels and 8 fps in RAW format, the SD card does not follow the writing and the pictures have to be stored in a cache. This is why the maximum continuous shooting rate or the duration in which pictures are taken in series is limited. Also, the SD card is quickly full. Using the inventive method (in the FPGA or chip) in the camera, one could take more than twice as long continuous shooting and store twice as many images on the SD card.

In a further example, when large videos are edited in video editors, the videos often have to be written to the hard disk in between and then read again. This is done in raw foitnat, because compression would take too long. Using the inventive method, one could accelerate the I/O. One second of a 4k movie with 30 Hz and 8 bit color depth is only 700 MB, but soon there will be 8 k movies with 60 Hz and 12 bit color depth, and that's already 8 GB/s. With fc16 as a plug-in for the video editors, customers could get faster I/O.

Finally, the inventive method could also be used for compressing a display stream from a graphics card to a monitor.

CONCLUSION

The compression ratio could be improved by making the algorithm stateful. A larger set of possible encodings could be defined, from which a subset may be chosen for the encoding of a block of 256 values. Depending on how often each encoding was used, a different subset might be chosen from the large set. For example, if the data is very noisy, there is no need to include the first 8 encodings of the list above, but instead they could be replaced with other encodings, which are better suited for larger numbers, like 10-bit range or 10-14 bitmask encoding. It is also possible to reduce the header size from 4 bits to 2 or 3 bits and only include those encodings that are useful for that kind of data.

The invention claimed is:

1. A computer-implemented method for fast lossless compression of digital data values, the method comprising:
   obtaining a sequence of digital data values;
   selecting bit lengths of code words, based on the sequence of digital data values, wherein the bit lengths of the code words are non-uniform;
   mapping the sequence of digital data values to a sequence of code words, each code word having one of the selected bit lengths;
   packing the sequence of code words into a sequence of storage words having uniform bit length and corresponding to a fixed-size piece of data handled as a unit by the instruction set or the hardware of a processor; and
   outputting the sequence of storage words, together with a first bitmask indicating the bit length of each code word,
   characterized in that the method is implemented using special-purpose vector instructions.

2. The method of claim 1, wherein the selection is made by comparing storage space requirements resulting from different code word bit lengths or code word bit length combinations.

3. The method of claim 1 or 2, wherein the selection is made using a binary search.

4. The method of claim 1 or 2, wherein the bit lengths are selected from the following bit lengths or bit length combinations: 0, 1, 2, 3, 4, 2/5, 5, 3/6, 6, 4/8, 8, 6/12, 12, 6/16, 8/16, 16.

5. The method of claim 1 or 2, wherein the code words have non-uniform bit lengths.

6. The method of claim 5, wherein the code words have exactly two different bit lengths.

7. The method of claim 6, wherein the two different bit lengths of the code words are one of the following combinations: 2/5 bits, 3/6 bits, 4/8 bits, 6/12 bits, 6/16 bits, or 8/16 bits.

8. The method of claim 1 or 2, wherein the bit lengths of the code words are at least two of 4, 6, 8, and 16 bits.

9. The method of claim 1 or 2, wherein the step of packing the sequence of code words includes first packing a sequence of L1 bits of each code word into the storage words, where L1 corresponds to the smallest bit length of the code words, and then packing the remaining bits of the code words having a bit length larger than L1 into the remaining storage words.

10. The method of claim 9, wherein packing the remaining bits of the code words having a bit length larger than L1 comprises first packing a sequence of L2-L1 bits of each remaining code word into the remaining storage words, wherein L2 corresponds to the second smallest bit length of the code words, and then packing the remaining bits of the code words having a bit length larger than L2 into the then remaining storage words.

11. The method of claim 1 or 2, wherein only the absolute values of the digital data values are mapped to code words.

12. The method of claim 11, further comprising the step of outputting information indicating, for each digital data value, its sign, preferably in the form of a second bitmask.

13. The method of claim 1 or 2, wherein the step of obtaining the digital data values comprises:
    receiving a block of original digital data; and
    transforming the block of original digital data in order to obtain the digital data values.

14. The method of claim 13, wherein the transformation approximates the original data values in the block and outputs residual values, the residual values representing differences between the original data values and their approximations.

15. The method of claim 13, wherein the block of original digital data is transformed using a wavelet transform.

16. The method of claim 15, wherein the wavelet transform is a morphological wavelet transform.

17. The method of claim 15, wherein the wavelet transform is an iterated wavelet transform.

18. The method of claim 17, wherein the wavelet transform is iterated 4 times.

19. The method of claim 1 or 2, implemented using AVX2 instructions.

* * * * *